(12) United States Patent
Wooldridge et al.

(10) Patent No.: US 11,732,682 B2
(45) Date of Patent: Aug. 22, 2023

(54) IN-SITU SENSOR FOR FUEL SPRAY IMPINGEMENT IN DIRECT INJECTION ENGINES

(71) Applicant: THE REGENTS OF THE UNIVERSITY OF MICHIGAN, Ann Arbor, MI (US)

(72) Inventors: Margaret S. Wooldridge, Saline, MI (US); Luis Gutierrez Arsuaga, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 230 days.

(21) Appl. No.: 17/124,579

(22) Filed: Dec. 17, 2020

(65) Prior Publication Data

US 2021/0180553 A1 Jun. 17, 2021

Related U.S. Application Data

(60) Provisional application No. 62/949,140, filed on Dec. 17, 2019.

(51) Int. Cl.
| | |
|---|---|
| *F02D 41/04* | (2006.01) |
| *F02M 65/00* | (2006.01) |
| *F02F 3/12* | (2006.01) |
| *F02B 77/08* | (2006.01) |
| *F02F 3/00* | (2006.01) |

(52) U.S. Cl.
CPC ......... *F02M 65/001* (2013.01); *F02B 77/084* (2013.01); *F02D 41/047* (2013.01); *F02F 3/0015* (2013.01); *F02F 3/12* (2013.01); *F02F 2200/00* (2013.01); *F02M 2200/24* (2013.01)

(58) Field of Classification Search
CPC .............. F02M 65/001; F02M 2200/24; F02B 77/084; F02D 41/047; F02D 19/084; F02D 35/02; F02F 3/0015; F02F 3/12; F02F 2200/00; F02F 3/00; Y02T 10/30; G03F 1/00
See application file for complete search history.

(56) References Cited

U.S. PATENT DOCUMENTS

| | | | |
|---|---|---|---|
| 6,790,341 B1* | 9/2004 | Saban | G01N 27/42 205/789 |
| 6,862,919 B2* | 3/2005 | Lin | G01N 27/226 73/304 C |

(Continued)

OTHER PUBLICATIONS

Alain Lunati et al. "Determination of Mixture of Methanol and Ethanol Blends in Gasoline Fuels Using a Miniaturized NIR Flex Fuel Sensor." Society of Automotive Engineers of Japan. 2011.

(Continued)

*Primary Examiner* — Freddie Kirkland, III
(74) *Attorney, Agent, or Firm* — Harness, Dickey & Pierce, P.L.C.

(57) ABSTRACT

A sensor device system for detection of a liquid adjacent to the sensor having a glass fiber laminate substrate, at least one pair of comb electrodes formed on the glass fiber laminate substrate, a first of the pair of comb electrodes being interdigitated with a second of the pair of comb electrodes, the pair of comb electrodes defining geometric parameters; and a passivation coating covering the pair of comb electrodes.

11 Claims, 15 Drawing Sheets

(56) References Cited

U.S. PATENT DOCUMENTS

| | | | | |
|---|---|---|---|---|
| 6,946,197 | B2* | 9/2005 | Yadav | H01F 1/0045 |
| | | | | 423/276 |
| 7,859,273 | B2* | 12/2010 | McCoy | G01N 27/122 |
| | | | | 73/304 R |
| 9,691,873 | B2* | 6/2017 | Rogers | H01Q 1/2283 |
| 10,408,896 | B2* | 9/2019 | Jamali | H01L 51/56 |
| 10,473,607 | B2* | 11/2019 | Tsai | G01N 27/125 |
| 2007/0139155 | A1* | 6/2007 | Chung | G01N 27/048 |
| | | | | 338/35 |
| 2012/0279858 | A1* | 11/2012 | Nuzzio | G01N 27/38 |
| | | | | 204/400 |
| 2013/0140649 | A1* | 6/2013 | Rogers | H01L 29/78603 |
| | | | | 438/48 |
| 2018/0175158 | A1* | 6/2018 | Rogers | B82Y 10/00 |

OTHER PUBLICATIONS

M.C. Drake et al. "Piston Fuel Films as a Source of Smoke and Hydrocarbon Emissions from a Wall-Controlled Spark-Ignited Direct-Injection Engine." SAE International. 2003.

Kyung-ho Ahn et al. "AFR-Based Fuel Ethanol Content Estimation in Flex-Fuel Engines Tolerant to MAF Sensor Drifts." IEEE Transactions on Control Systems Technology, vol. 21, No. 3, May 2013.

T. Hofamnn et al. "Comparison of a conventional with an advanced micromachined flexible-fuel sensor." Sensors and Actuators A 61 (1997).

Renato Alves De Souza et al. "Turbocharged flex fuel vehicles with virtual ethanol content identification." SAE Technical Paper Series (2017).

Ligia Bueno et al. "A copper interdigitated electrode and chemometrical tools used for the discrimination of the adulteration of ethanol fuel with water." Talanta 87 (2011) 210-215.

John J.C. Kopera et al. "Methanol Concentration Smart Sensor." SAE Technical Paper Series. 1993.

Todd D. Fansler et al. "Spray measurement technology: a review." Measurement Science and Technology 26 (2015).

* cited by examiner

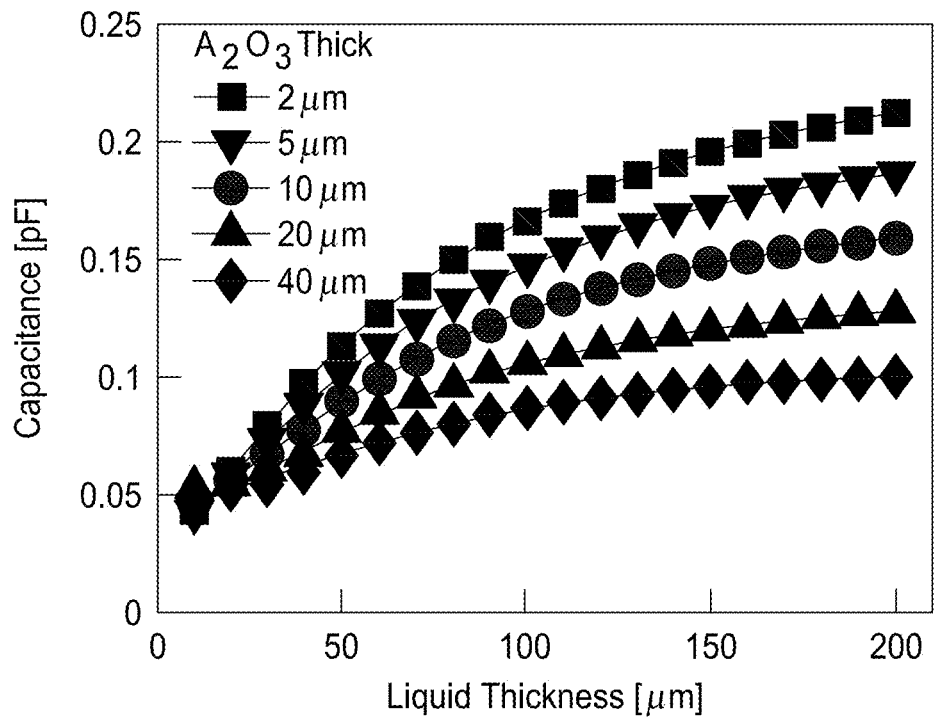
FIG. 3D
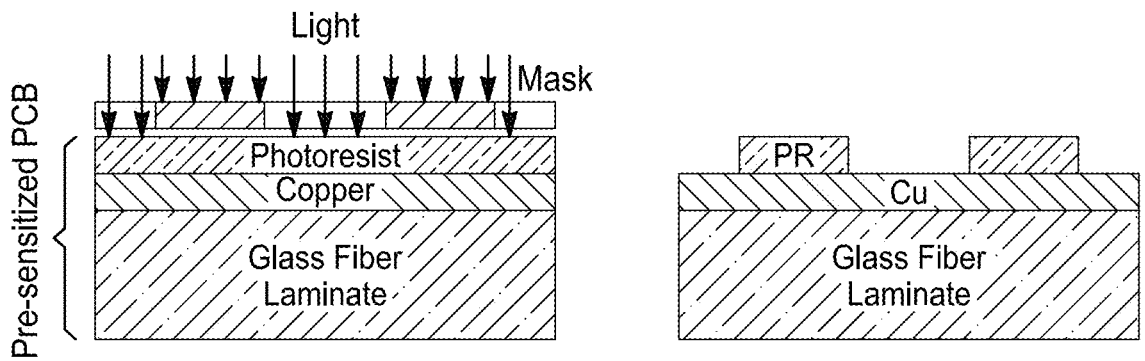
FIG. 4A
FIG. 4B
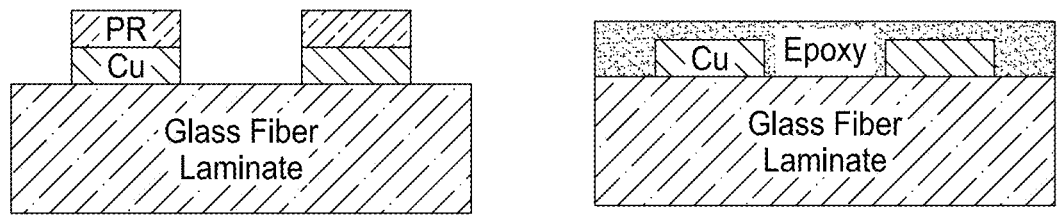
FIG. 4C
FIG. 4D

| Variable | Value |
| --- | --- |
| Fuels | E10, E20, E50, E80 |
| Injection Durations | 0.5, 1.0, 1.5, 2.0 ms |
| Fuel Pressures | 30, 50, 100 bar |
| Piston Position | 300°bTDC |
| Fuel/Air Temperature | 24°C ± 2 |

FIG. 17

IN-SITU SENSOR FOR FUEL SPRAY IMPINGEMENT IN DIRECT INJECTION ENGINES

CROSS-REFERENCE TO RELATED APPLICATIONS

This application claims the benefit of U.S. Provisional Application No. 62/949,140, filed on Dec. 17, 2019. The entire disclosure of the above application is incorporated herein by reference.

FIELD

The present disclosure relates to direct injection engines and, more particularly, relates to an in-situ sensor for measurement of fuel spray impingement in direct injection engines.

BACKGROUND AND SUMMARY

This section provides background information related to the present disclosure which is not necessarily prior art. This section provides a general summary of the disclosure, and is not a comprehensive disclosure of it full scope or all of its features.

In the context of modern combustion research, the internal combustion (IC) engine is no longer a black box. Several means for optical access and probing tools into the combustion chamber have led to advances in understanding, predicting, and designing for specific fuel spray characteristics, charge motion, spark plasma development, combustion, and emission mitigation. The field has benefited from the development of complex techniques like particle image velocimetry, phase Doppler anemometry, high-frequency momentum and pressure transducers, and high-speed imaging-based methods.

It is undeniable that advanced diagnostic tools and probing instrumentation have greatly expanded our understanding of in-cylinder phenomena and helped in improving engine performance and emissions. Nonetheless, certain engine processes remain poorly understood, and engine design would benefit from the development of novel diagnostics to elucidate into the nature of these phenomena. Specifically, characterization tools are lacking for fuel impingement, spray-wall interaction, and film evaporation; these complex processes are recognized as some of the key challenges in engine research.

Fuel films are formed during typical operation of reciprocating internal combustion engines and have critical effects on engine performance and emissions. Films are formed on liner, piston, and valve surfaces as a direct result of fuel impingement during injection, fuel rebound, and fuel condensation. A wide range of experimental data have been reported on fuel films, with film thickness ranging from 0.1 to 100 μm, and surface areas of 10s to 100s of $mm^2$, depending on conditions and operating parameters. These thin films have been identified as sources of fine particulate matter (PM) and unburned hydrocarbon (UHC) emissions, and as the cause of coking and varnishing of gasoline direct fuel injectors. Therefore, surface wetting by liquid films is a critical design concern for modern spark ignition and compression ignition engines.

Liquids droplets interact with surfaces in a plethora of natural and artificial processes, like raindrops hitting surfaces, spray painting and coating, urea injection, and plant fertilization, just to name a few. Spray-wall interactions involve complex multiphase phenomena that are governed by both the thermophysical properties of the fluids (i.e., the liquid and the ambient gas) and the surface characteristics of the wall. A better understanding of spray-wall interaction has been developed through single- and multiple-drop experiments. Multiple conceptual models have been proposed to explain and capture the conclusions of the experimental work. These models frequently consist of different regimes for the dynamic formation and evolution of the spray-wall interactions, including hydrodynamic and heat transfer regimes. Common mechanisms in the models include droplet rebound, deposition, spread, splash, evaporation, and Leidenfrost effect. The dominating mechanisms controlling liquid film formation depends on the density, surface tension, and viscosity of the liquid used in the spray; drop size, shape and velocity; ambient gas pressure and temperature; and surface temperature, roughness, and wetness.

Within the engine research community, pioneering and innovative methods have been developed and used to study fuel impingement in and outside optical engines for diesel, gasoline, and biofuel sprays. The methods include laser-induced fluorescence, refractive index matching, infrared thermography, high-speed imaging, and gravimetric techniques. Based on these techniques, crucial factors controlling film formation and behavior have been identified, including injection pressure, engine surface temperatures, injection duration, and in-cylinder flow. Although these are powerful techniques, they have different drawbacks when measuring films in conditions relevant to reciprocating engines. Additionally, these methods are difficult to scale to a variety of engine platforms, as they require expensive instrumentation, or the techniques cannot operate in-situ to measure in-cylinder films. What is missing is a less expensive, simple, robust, and versatile method to measure the fundamental characteristics of the spray-wall interaction and fuel films that form in engines.

According to the principles of the present teachings, capacitive sensor technology is provided to measure films to characterize fuel impingement and the films generated by non-reactive sprays, and to demonstrate the efficacy of the sensor in a single-cylinder optical engine. The sensor of the present teachings was designed to help develop fundamental understanding of spray impingement and film characteristics, which are critical for reducing empiricism and developing comprehensive physics-based theory for spray-wall interactions.

Some challenges of developing a capacitive sensor are due to the intrinsic properties of fossil fuels. Specifically, the relative permittivity is a key property that determines the sensitivity of the capacitive response to a liquid. For petroleum-derived fuels, the relative permittivity is typically close to the relative permittivity of air. Hence, a capacitive sensor would display low sensitivity to thin films formed by these fuels in air. To address this fact, the present teachings uses ethanol and ethanol-gasoline blends as fuel surrogates as ethanol has much higher relative permittivity than air, which increases the sensitivity of the present sensor. This approach is also relevant since ethanol is a fuel with significant use in the transportation sector. Ethanol is commonly used as an automotive fuel at blend rates from 10% to 85% by volume in the U.S. and, in countries like Brazil, ethanol is used neat (100% hydrous ethanol) as pump fuel.

Ethanol is currently commercially available in the U.S. in three main nominal ethanol-gasoline blend concentration: E10, E15, and E85, where the numeric values signify the ethanol volume percentage (i.e., E15 represents a 15% ethanol, 85% gasoline blend per volume). However, the fuel found at gas pumps and branded as E85 actually has a variable ethanol content that spans from 51% to 83% depending on the local geographical and seasonal characteristics. Ethanol content has direct impacts on the behavior of the fuel spray, ignition of the mixture, engine emissions, and overall performance of the engine. Thus, sensors that provide information on the actual ethanol volume in a fuel are also important to engine performance.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIGS. 3A-3D show simulation results for the capacitance response using 100% ethanol films for varying electrode width, spacing gap, number of interdigitated electrode (IDE) pairs, and insulating film (Al2O3) thickness.

FIG. 4 is a diagram of the steps used to fabricate the IDE capacitor sensor including contact photolithography, photoresist developing, chemical etching, and passivation coating processes.

FIG. 17 shows explored experimental conditions for fuel spray impingement tests.

Corresponding reference numerals indicate corresponding parts throughout the several views of the drawings.

DETAILED DESCRIPTION

Figure 1:
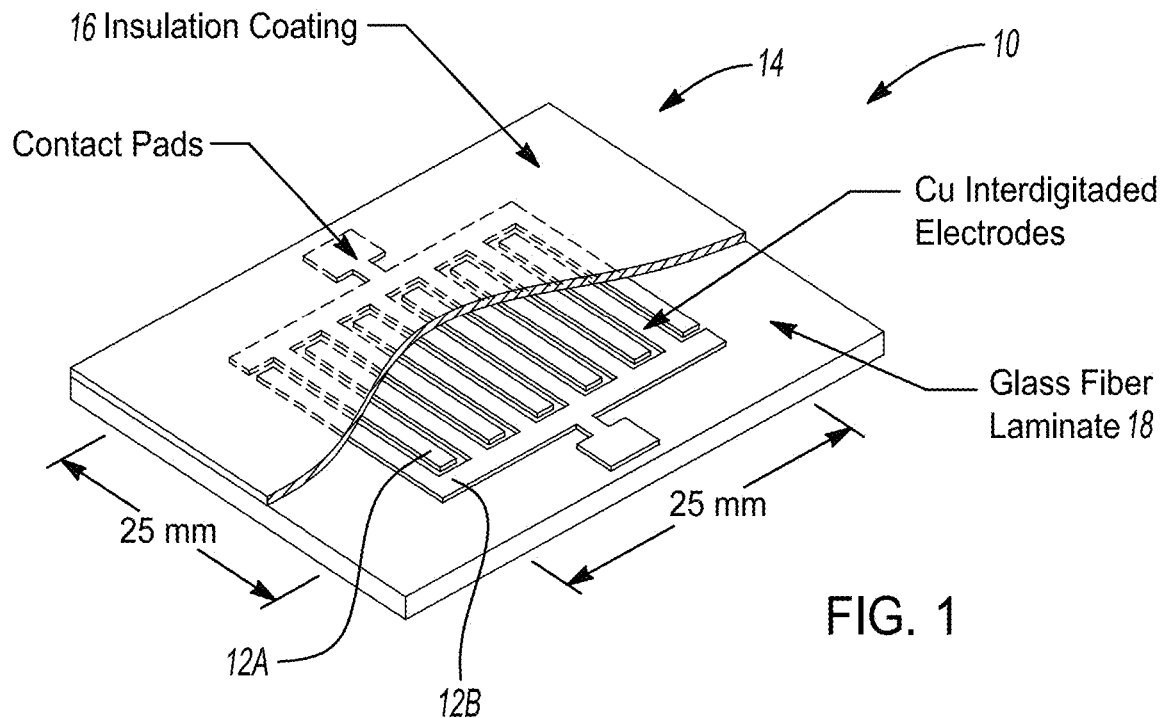
FIG. 1 is a schematic of the interdigitated electrode sensor according to some embodiments of the present teachings.

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The development of the sensor according to some embodiments of the present teachings was guided by design objectives that were considered central to making a useful and versatile tool. The design goals included in-situ operation, non-contact data transmission, high-spatial sensitivity, high-temporal response, and low-cost fabrication. In-cylinder phenomena are usually hard to replicate, so in-situ measurements of fuel impingement are required to better represent the relevant phenomena occurring inside an engine. In some embodiments, the sensor had to be small and lightweight to enable instrumenting a piston and to allow data to be retrieved without wires integrated with the moving components of the engine. From the literature review, the films were expected to be a few microns in thickness, so having high sensitivity in that range of film thickness was essential. The temporal response was also crucial since an engine cycle usually spans a few dozen milliseconds, and injection durations are considerably shorter than that, ranging from hundreds of microseconds to a few milliseconds. Finally, the sensor should be accessible from a financial standpoint, so the cost of the fabrication was kept low.

In some embodiments, the sensor device system 10 developed in accordance with the present teachings is based on a capacitive sensing technique. In some embodiments, the device system 10 comprises two comb electrodes 12 (12A, 12B, collectively referred to as 12) made out of copper that are interdigitated to form the coplanar capacitor 14, with a sensing area of 25×25 mm. To prevent charge leakage and circuit shorts, the electrodes 12 are covered with a passivation coating 16. The electrodes 12 rest on a glass fiber laminate substrate 18. The geometric parameters for the structures were varied in a computational study discussed in the following section.

FIG. 1 shows a schematic (not to scale) of the sensor design 10. The capacitance of the system 10 is a function of the spatial characteristics and the permittivity of the medium that is in contact with the surface of the electrodes 12. If the relative permittivity of a fuel is higher than that of air 100, the capacitance of the system 10 will increase as a liquid film forms on the surface due to the higher level of polarization. The capacitance would tend to increase as the film becomes thicker.

Figure 2A:
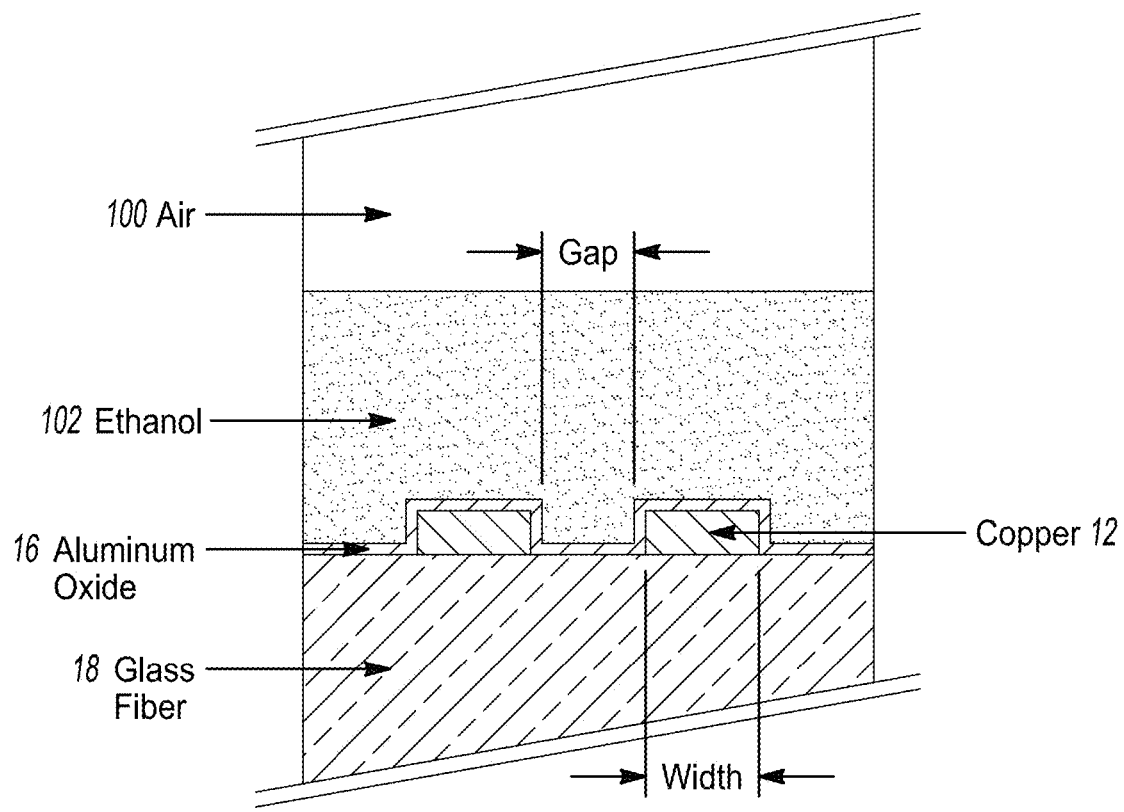
FIG. 2A is a simplified coplanar capacitor model programmed for use in finite element model simulations (COMSOL).

2D finite element simulations (COMSOL Multiphysics) of a simplified coplanar capacitor 14 according to the principles of the present invention were used to evaluate the effectiveness of the present design and understand the effect of the geometric parameters on the interdigitated electrode (IDE) capacitor 14. FIG. 2A presents a sample geometry of the 2D model. The electrodes 12 are represented in the model as of copper with a thickness of 35 µm. Parametric studies were performed varying electrode width and the spacing; the effects of the number of electrode pairs and the thickness of the insulation coating 16 were also considered. The base geometry used a single electrode pair, electrode gaps and width of 100 µm. During the studies, a single parameter was varied while the others were kept at the base values. Designs with electrode "fingers" widths ranging from 25 to 200 µm and spacing gaps of 25 to 150 µm were considered and evaluated. For the computational component of the work, the passivation coating 16 was a conformal layer of alumina.

Two main output variables were of interest in the simulations: the capacitance of the electrodes as a function of the film thickness and geometric parameters, and the electric polarization field medium in contact with the IDE 14. The polarization field describes the spatial response of a material when exposed to an electric field between two electrodes, since it indicates the strength of the induced electric dipole moment in the substance. The molecules of a polar substance, like ethanol 102, orient themselves along the direction of the electric field and oppose the applied voltage. This effectively increases the charge concentration at the electrodes 12, which in turn increases the capacitance of the system 10.

Figure 2B:
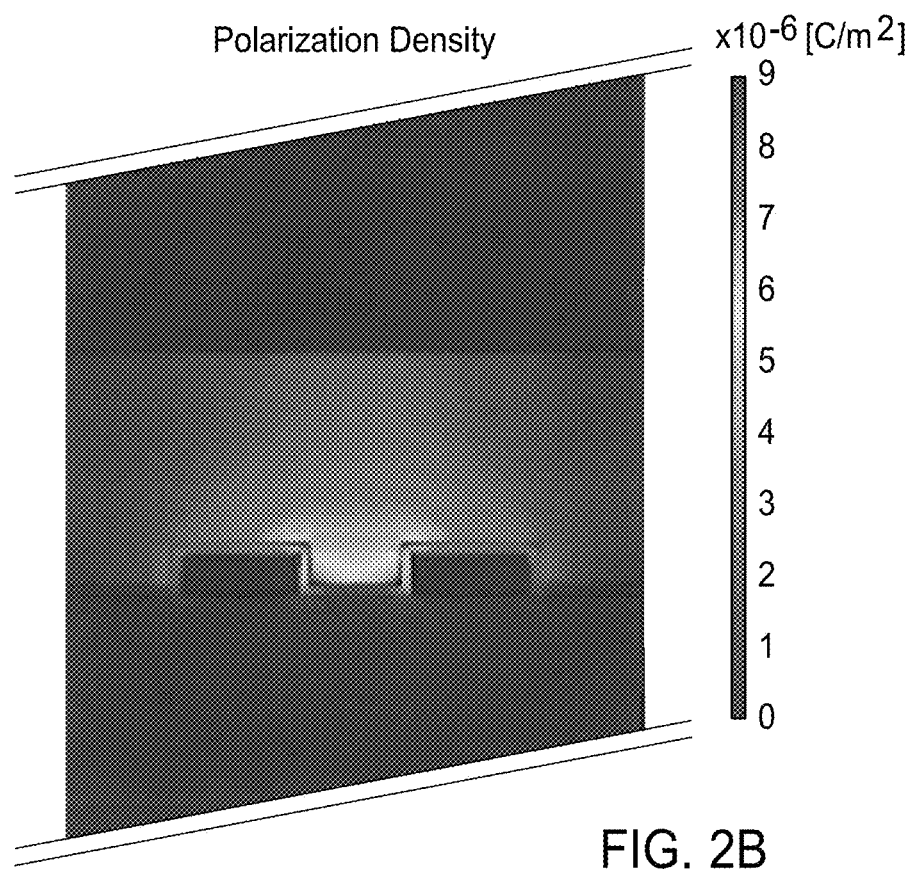
FIG. 2B shows simulation results for the polarization density field of the sensor and liquid ethanol film.

FIG. 2B shows the predicted polarization density for the reference sensor design 10 in the presence of a 100% ethanol film 102 of 200 µm thickness with an applied voltage of 3V. The results show ethanol is considerably more polarized than air 100 in the presence of the electric field. A second important observation is that the polarization field is concentrated within a semi-ellipse that extends from the midpoint of one of the electrodes 12 to the midpoint of the second electrode 12, and the polarization field penetrates into the liquid 102 to about half of the width of the electrodes 12. Based on these results, an expectation is that the sensor 10 would start losing sensitivity to films that extend past the half-width of the electrode. Although, the present design 10 is not a completely flat capacitor—since the thickness of the electrodes is not negligible—this finding is consistent with analytical solutions found in the literature for purely flat coplanar capacitors.

Figure 3A:
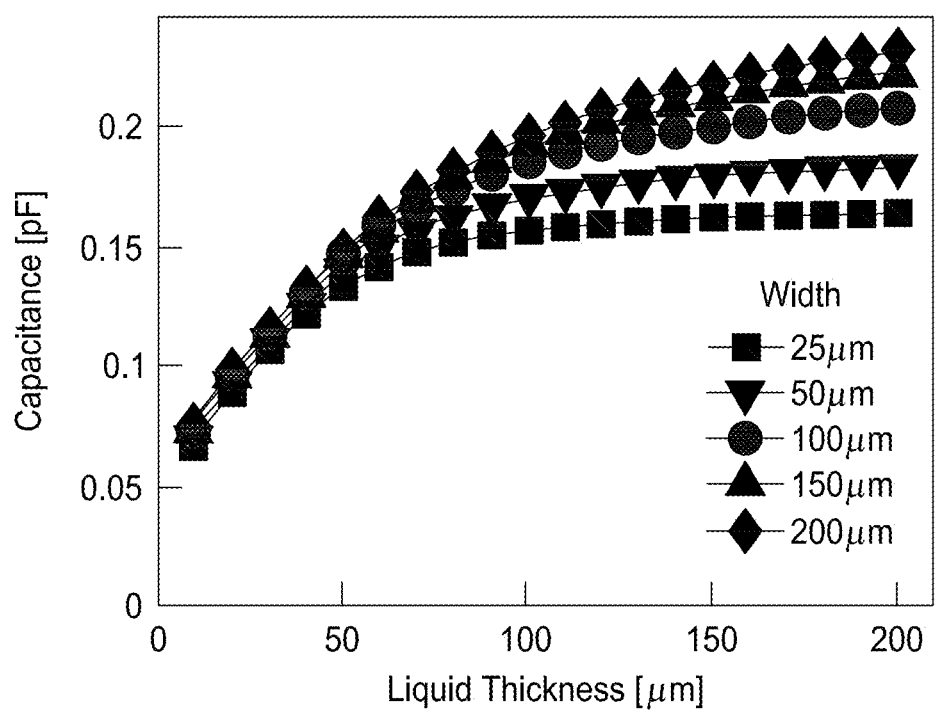

FIGS. 3A-3D presents the results for the capacitance of the device obtained from the parametric studies. FIG. 3A shows the capacitance of the device as a function of 100% ethanol film thickness for different electrode widths. All electrode widths had similar behaviors for films thinner than 50 µm. However, the capacitance of the IDE starts saturating when the film reaches a thickness comparable with the electrode width; beyond that point, the sensor sensitivity tends to decrease. The trend is explained by the results shown in FIG. 2B. From a design perspective, one can prevent reaching this limit by selecting an electrode width at least twice as big as the maximum expected fuel film thickness.

Figure 3B:
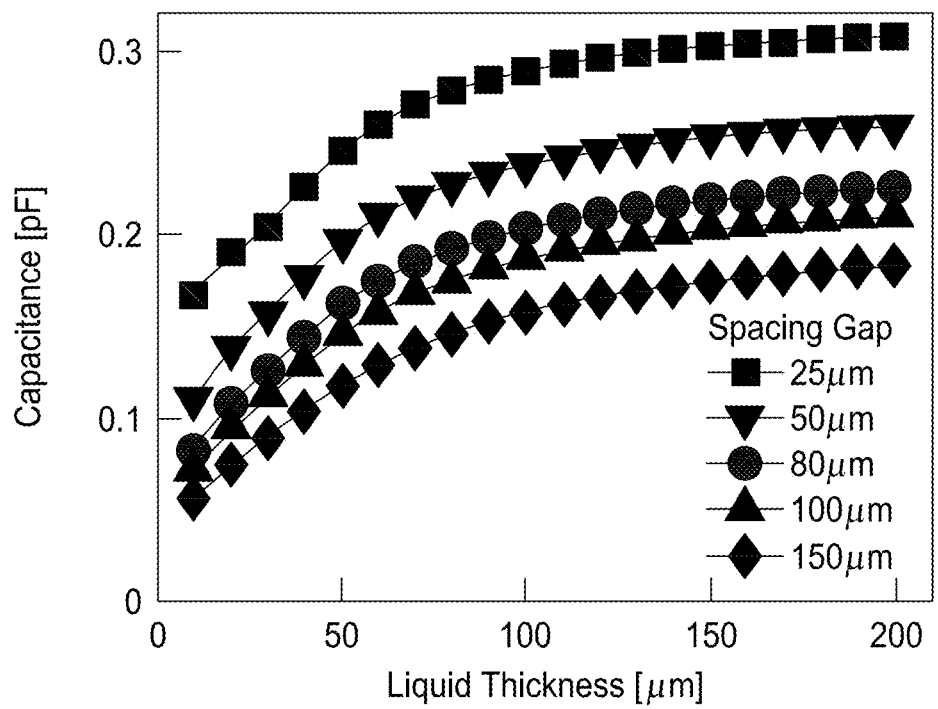

FIG. 3B depicts the effect of the electrode spacing: as the gap decreases, the sensor becomes more sensitive. It would be desirable to maximize the response of the device to films thinner than 100 µm, so this gap should be as smaller as possible. Nonetheless, on the physical device, the spacing will be limited by the resolution and tolerance of the fabrication process. A trade-off between sensitivity, manufacturability, and fabrication cost must be considered to achieve the best overall results.

Figure 3C:
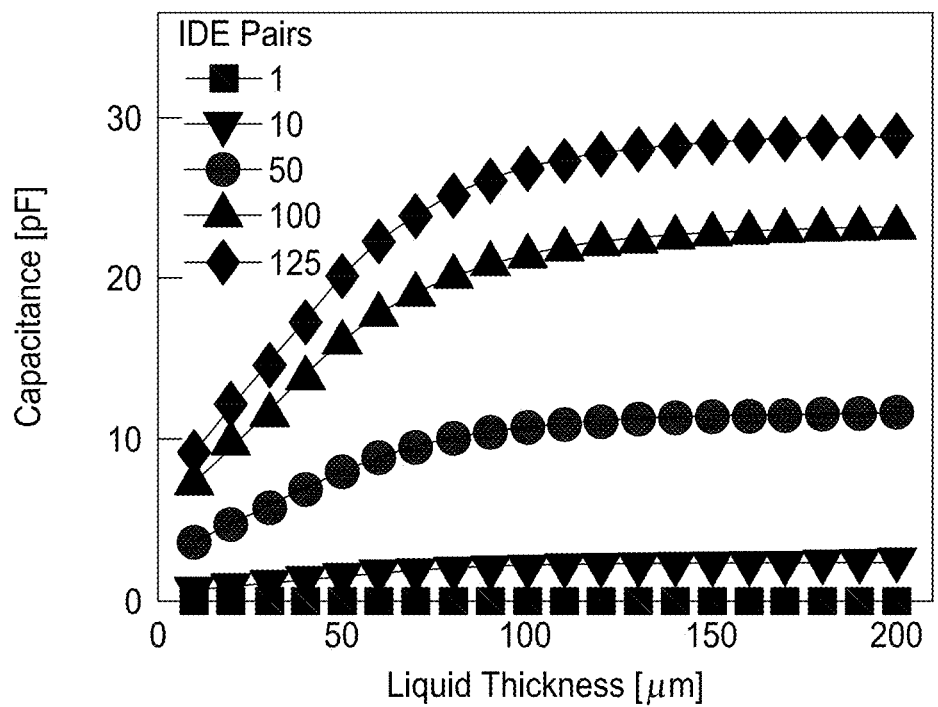

FIG. 3C presents the effect of the number IDE pairs. The plot indicates that the sensor sensitivity drastically increases as electrode pairs are added. In fact, the capacitance system scales almost proportionally to the number of electrodes.

Lastly, FIG. 3D displays the effect of the coating thickness on the response of the capacitor and show that the capacitance increases for thinner coatings. Therefore, a thin coating would offer a better response of the sensor, although proper electrical insulation is desired as well.

Based on these results, and taking into account fabrication limitations, several IDE platforms were fabricated with the following geometric parameters: 150 µm in electrode width, spacing gap of 50, 80, and 100 µm, and with as many electrode pairs as they could be fit 25 mm depending on the spacing gap (i.e., 100, 108, or 125 pairs, respectively).

To demonstrate and test the physical performance and functionality of the device 10, interdigitated electrodes 12 were fabricated using a similar procedure as the one used on printed circuit boards (PCB) for homemade analog circuits. However, as the simulation results showed, the electrode structures must be in the micron size regime to achieve the desired sensitivity. Amateur circuitry does not require that level of resolution, so little literature is available with that specific purpose. Therefore, a custom lithography process was developed until the aspect ratio and resolution on the design were satisfactorily obtained. The fabrication process was optimized by varying the exposure time, the distance between the light source and the sample, the developing time, and the etching time. These processes are discussed in further detail below and shown in FIGS. 4A-4B. It should be noted that it was desired to fabricate an inexpensive device, so all the fabrication process was performed outside a cleanroom.

Figure 5:
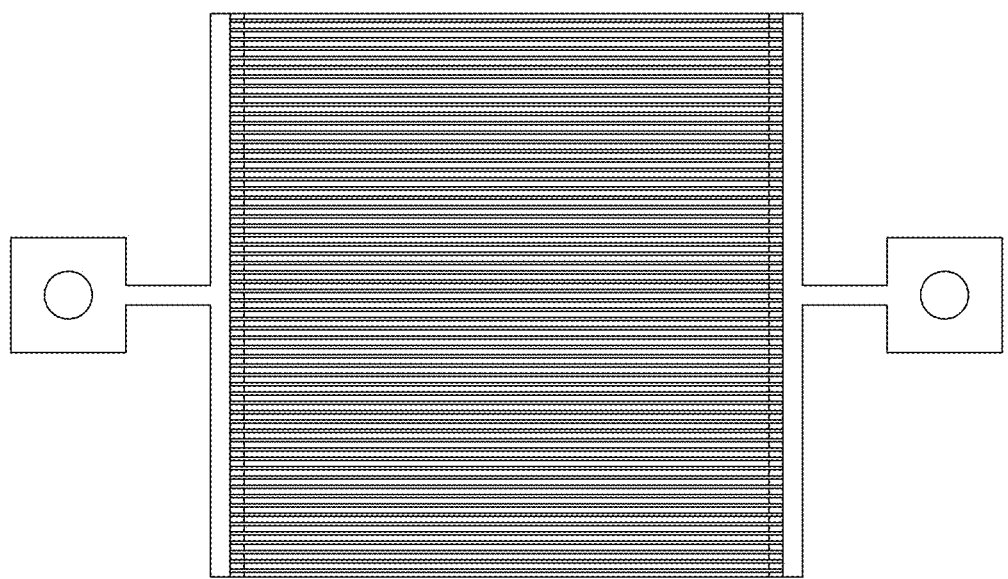
FIG. 5 is a photomask design used for the photolithography process corresponding to electrode widths of 150 µm and gaps of 80 µm.

A positive pre-sensitized copper-clad board (GC Electronics, 21-334-VP) was used as a starting point for the fabrication. The board consists of a single copper layer (35 µm in thickness) sandwiched between a photoresist and a fiberglass-epoxy laminate, commonly called FR-4. A side-view schematic of the board can be found in FIG. 4A. Contact photolithography using a photomask printed at 5,000 dots per inch (dpi) was performed to transfer the electrode design into the photoresist. The board was exposed for 17 minutes to a 23 W fluorescent light (1600 lumens, 6,500 K) at 30 cm from the light source, while a glass pressed the mask against the photoresist. Three masks were used to obtained different gap and electrode width patterns. The photomask designs had electrode widths of 150 µm and gaps of either 50, 80, or 100 µm. One of the mask designs is presented in FIG. 5; the electrodes are not properly displayed due to the limited resolution of this document.

After the sample was exposed, the board was immersed in a solution of distilled water and positive photoresist developer (MG Chemicals #418) at a 10:1 volume ratio for 4 minutes. Next, the developed sample was chemically etched using a solution of one-part hydrochloric acid (Sunnyside, 31.45% HC1, 20° Baume) and two-parts of hydrogen peroxide for around 23 minutes. A multimeter was used to verify that the electrode terminals were electrically disconnected from each other, indicating that the copper was completely etched to the bottom of the board. The remaining photoresist layer was removed with acetone. For the passivation coating, alumina deposition was first tried, but better results were obtained using an epoxy layer. The epoxy was applied with a spatula so that a thin flat layer covered the sensing area. After fabrication, visual inspection indicated the IDE with electrode widths of 150 µm and gaps of 80 µm had the best fabrication quality (e.g., uniformity, resolution, etc.), so this geometry was used for the experiments discussed here. Although, in some embodiments, the electrodes are made of copper, it should be understood that other electrically conductive materials could be used. By way of non-limiting example, these materials could include gold, tungsten, silver, and platinum. Similarly, other dielectric materials could be used for the passivation layer, like silicon oxide, silicon dioxide, silicon nitride, or silicon carbide.

To interface and monitor the response of the IDE element, a metering circuit based on a resistor-capacitor (RC) resonator was assembled and connected to the electrodes. The resonant frequency of the entire system was then measured to detect changes in capacitance. The circuit outputs an oscillating signal with a frequency determined by Equation 1

$$f = \frac{1}{2\ln(3)RC} \tag{1}$$

where f represents the resonant frequency [Hz], R is the resistance of the circuit [Ω], and C is the total capacitance [F].

To characterize the metering circuit, the system was initially connected directly to a data acquisition (DAQ) system programmed with a LabVIEW routine. The DAQ consisted of a digital card and chassis from National Instruments (NI-9401 and NI cDAQ-9174). Instead of acquiring the direct digital signal from the sensing circuit, the DAQ system was set up to operate as a digital frequency counter. In this mode, the DAQ uses an 80 MHz internal time-base to measure the input frequency signal and achieve more accurate results.

The frequency response of the RC oscillator in Equation 2 dictates, in part, the temporal resolution of the sensor, since it fixes the rate at which the sensing element can be probed. Accordingly, for a given capacitance range, the resistance value in the RC resonator has to be optimal so the sensor is fast enough to capture the dynamics of the spray impingement. On the other hand, the temporal response of other circuit components has to be considered as well, especially the speed at which the telemetry system (described in the next section) can accurately transmit and receive data. The resistor was selected by connecting the IDE element and performing experiments until an appropriate frequency was obtained. A resistor with a value of 100 kΩ was selected, which enabled a sensor response in the sub-millisecond region.

Figure 6:
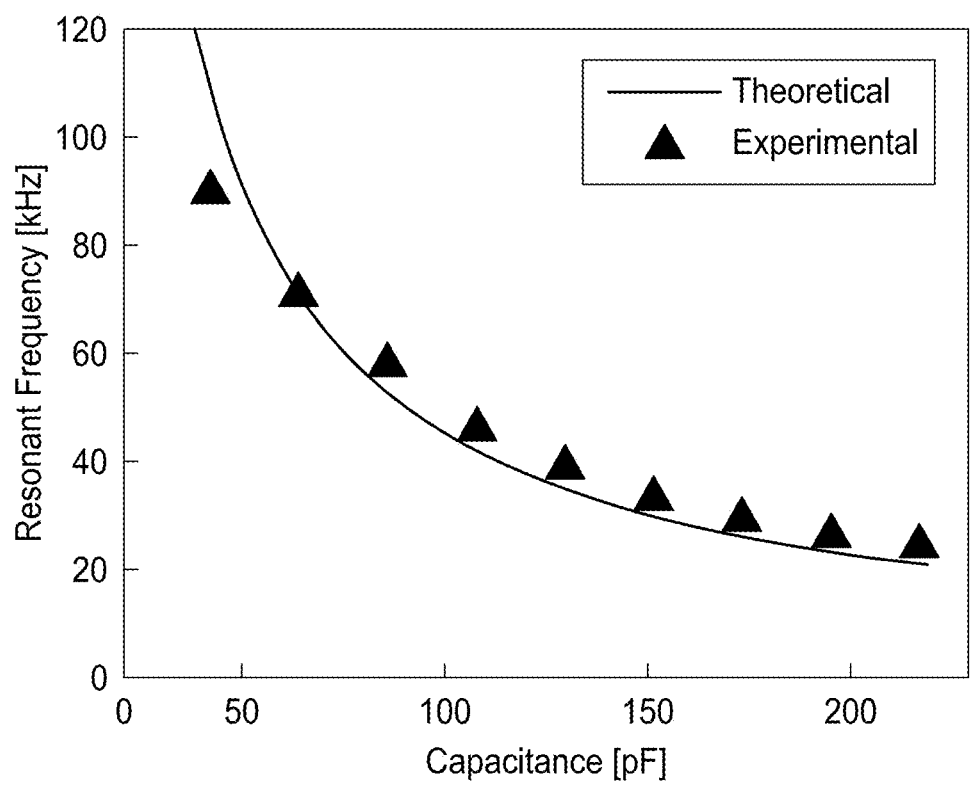
FIG. 6 is a comparison of the experimental and model predictions for frequency response of the sensing circuit as a function of capacitance.

The response of the resonator was characterized by monitoring the frequency as capacitors with known value were added to the circuit. The resonant frequency response to varying capacitance is displayed in FIG. 6. The solid line represents the theoretical oscillating frequency based on Equation 2, while the blue symbols show the experimental calibration. The maximum error between the expected and measured data is approximately 10%; the difference is most likely an outcome of the parasitic resistance and capacitance of the circuit and its components.

A frequency of 65 kHz was detected when connecting the IDE capacitor to the circuit. Based on the results plotted in FIG. 6, this frequency indicated that the sensor had a capacitance of approximately 70 pF when exposed to air. When the sensor is exposed to a liquid film with higher permittivity than that of air, the oscillating frequency relaxes following the curve shown in FIG. 6 due to the increase in capacitance.

To achieve in-situ measurements of spray impingement in an engine, the IDE 10 was mounted on a custom-made aluminum insert member that fit inside the optical piston shell 202 (89.0 mm in diameter) used for the imaging studies. The aluminum insert 203 consisted of two parts: the upper portion 204 held the sensor 10 in place, while the lower portion 206 had a small chamber 208 where the metering circuit 210, a battery pack, and a switch were located. A threaded ring held the two-piece aluminum insert in place.

Leads 212 ran from the sensor 10, through the upper part of the insert 204, and into the chamber 208 where it was connected to the metering circuit 210. An infrared light-emitting diode 214 (IR LED, 940 nm, Gikfun) was connected to the metering circuit 210 and secured to the bottom surface of the aluminum insert 203. The LED 214 was connected to the circuit 210 so that it would flash at the oscillating frequency from the RC resonator.

Figure 7:
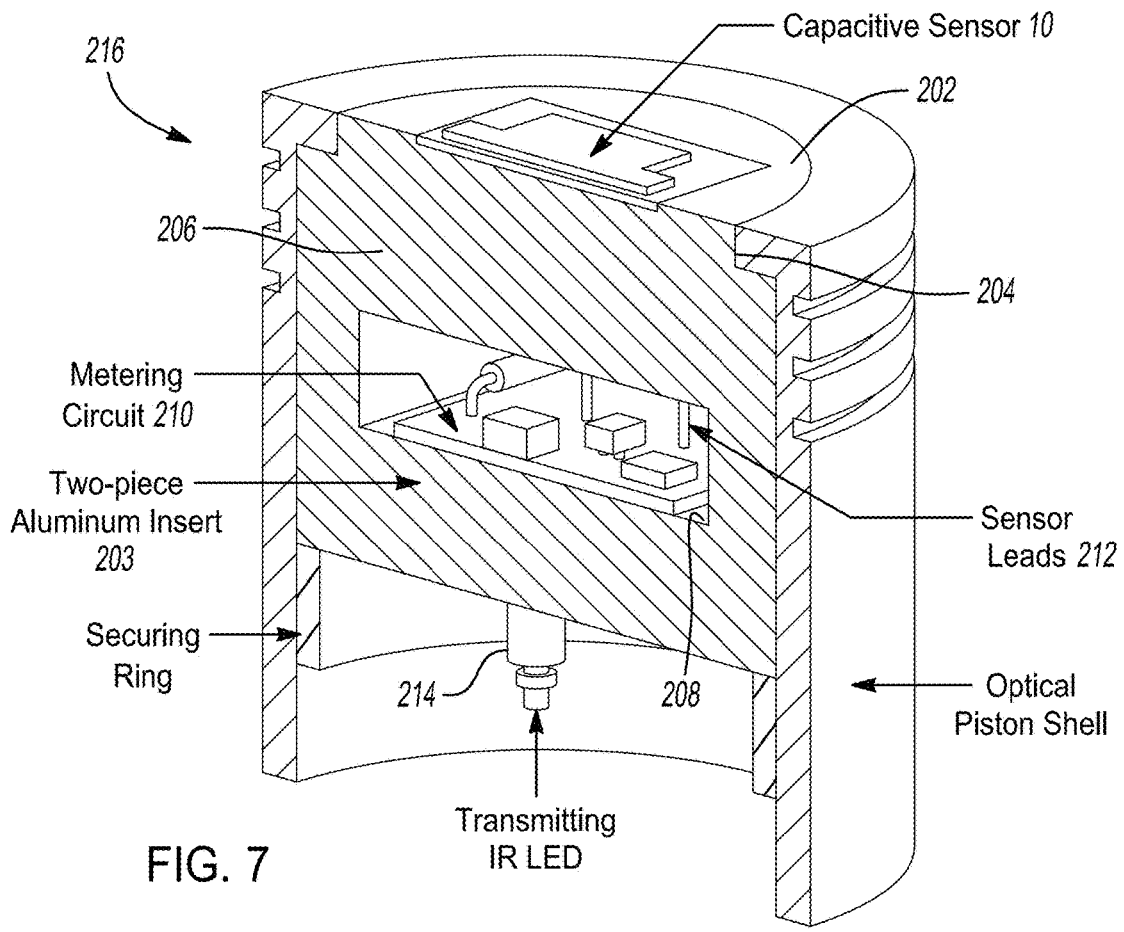
FIG. 7 is a cross-sectional view of a computer-aided design (CAD) model for the instrumented piston with the mounted capacitive sensor and non-contact data transmission circuit according to some embodiments of the present teachings.

FIG. 7 presents a cross-sectional view of a CAD model for the instrumented piston with the sensor mounted on the aluminum insert, the metering circuit, and the IR LED for transmitting the oscillating frequency.

Figure 8:
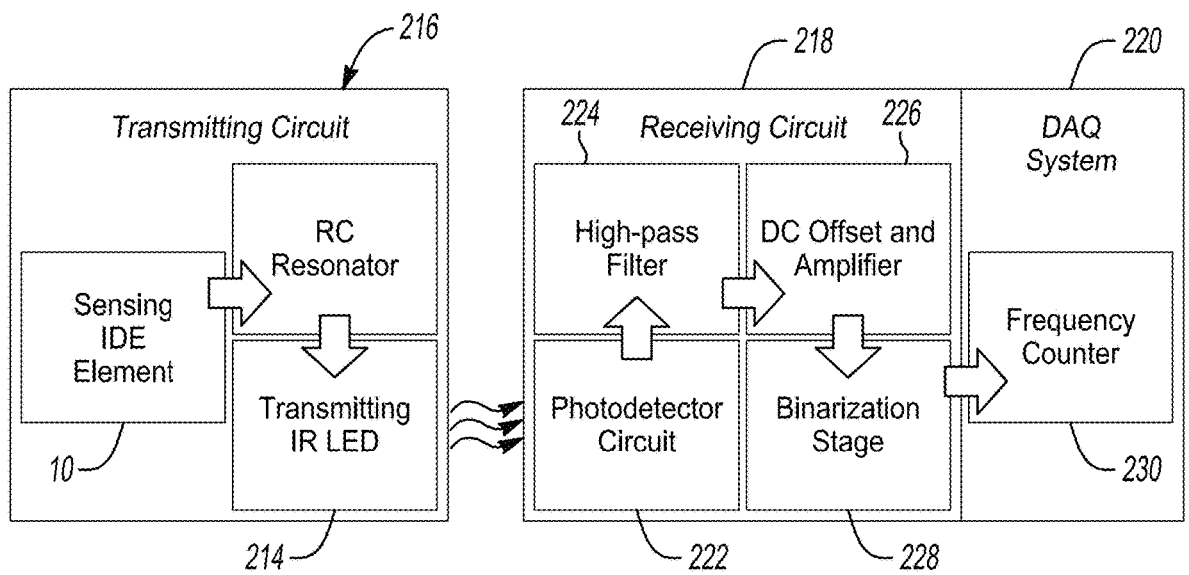
FIG. 8 is a schematic of the capacitive sensing circuit with a transmitting light emitting diode (LED) and photodetector for non-contact data transmission according to some embodiments of the present teachings.

A receiving circuit 218 was built to monitor the flashing frequency of the LED 214. Since the input for the DAQ frequency counter 220 described earlier requires a 5V digital signal, the receiving circuitry 218 was designed as a multistage conditioning circuit consisting of four steps. The first stage of the receiving circuit 218 consisted on a transimpedance photodetector 222 made with an infrared (IR) photodiode (940 nm, Gikfun) and a JFET operational-amplifier (TL082, Texas Instruments) with a feedback gain of 1,000. The second stage was a high-pass filter 224 with a cut-off frequency of 1500 Hz. This phase eliminates the unwanted signal that the reciprocating movement of the piston would introduce-a low-frequency noise in the range of 2 to 50 Hz. The third step applies a second amplification and DC offset 226 so the signal is within transistor-to-transistor logic (TTL) levels. The final stage 228 translates the analog signal into a square binary signal with proper digital levels. This signal is input to a frequency counter 230 operated using a LabVIEW routine, where the data were logged into a text file for further analysis. FIG. 8 shows a diagram with the transmitting and receiving circuits.

Figure 9:
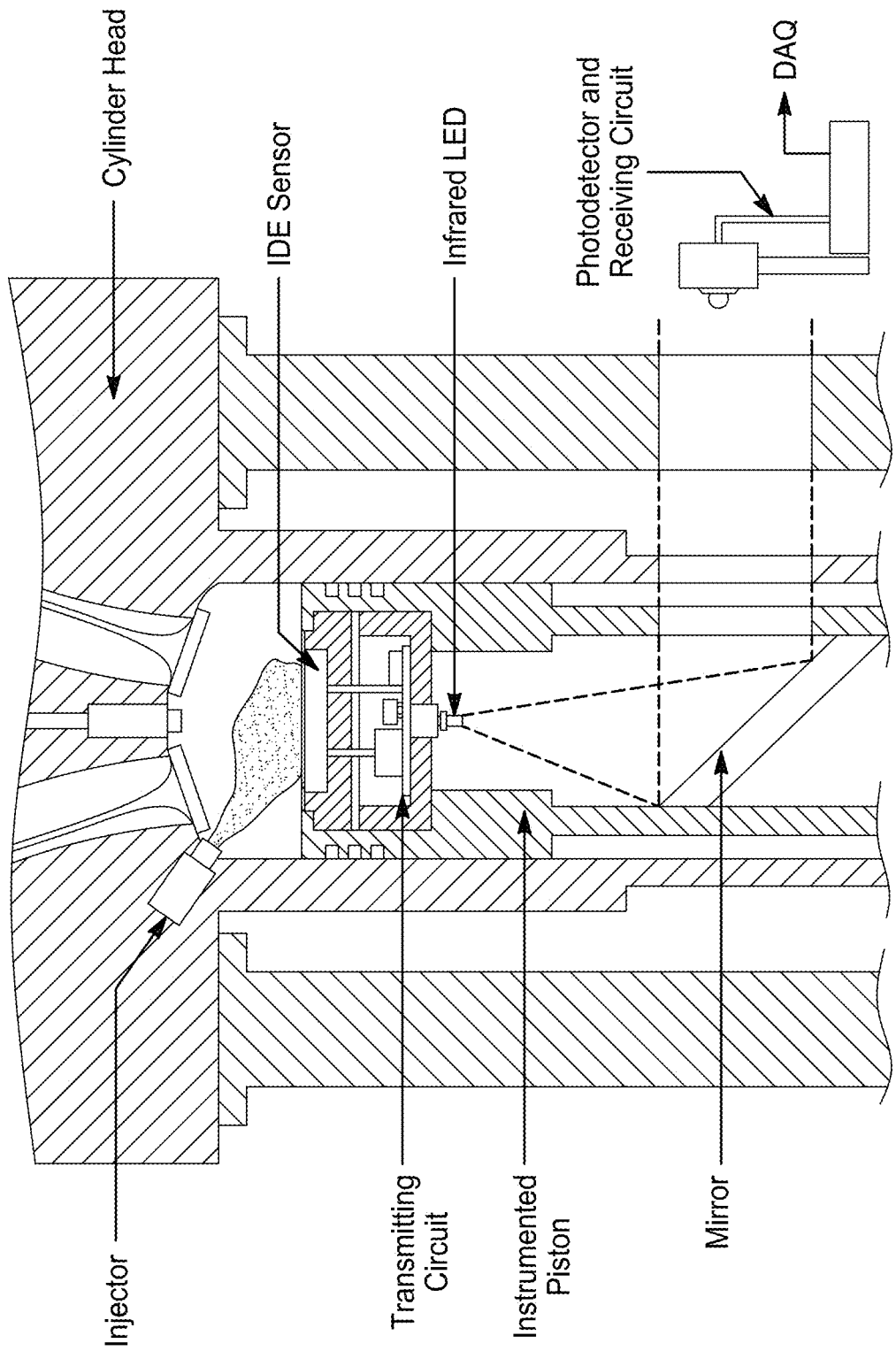
FIG. 9 is a schematic of the instrumented piston inside the single-cylinder optical engine and data acquisition method according to some embodiments of the present teachings.

The instrumented piston was placed inside the single-cylinder optical engine. However, the engine was not motored; rather the piston was kept at a fixed location of 300° before top dead center (bTDC). A mirror with a 45° tilt angle was placed underneath the piston and was used to reflect the IR signal towards the photodetector and the receiving circuit located outside the engine. In this way, the response of the sensor was monitored without having wires connected to the engine, thus achieving a non-contact data transmission DAQ system. A microcontroller (Arduino UNO Rev3) was used to trigger the data acquisition and control the injection events. FIG. 9 presents a schematic of the experimental setup used to test the film sensor in the single-cylinder engine. Injection pressure, injection duration, and ethanol content were varied to characterize the response of the sensor to different injection conditions and spray impingement characteristics. The surrounding air and fuel temperature were kept at ambient conditions (24° C.±2). FIG. 17 is a table that summarizes the conditions tested.

The injection experiments were imaged using a high-speed Mie scattering technique to capture the development of the liquid spray and compare optical data to the sensor results. A camera (Phantom V711-8G-MAG-C) captured the fuel spray at 41,000 frames per second (fps) with an exposure time of 24 μs and a resolution of 512×304 pixels, which gave a spatial resolution of 182 μm/pixel at the focus plane. A telephoto lens (Elicar V-HQ macro MC 90 mm) with an f-stop of 5.6 was used and focused at the center plane of the cylinder. The spray was illuminated using two white LED arrays (Visual Instrument #600420). An image-based trigger was used to trigger the camera and synchronize imaging with the sensor data from the DAQ system.

High-speed Mie-scattering has been previously used to study fuel impingement of direct-injection systems. Imaged gasoline, ethanol, and E50 sprays in an optically-accessible engine, and used the luminosity at a pixel column close to the cylinder wall to quantify the flux of fuel that impinged on the surface. In the present disclosure, the inventors define the line integrated luminosity (LIL), which was the integration of the grayscale values of the pixels at a given boundary of interest as a function of time:

$$\text{LIL} = \int I_{pixel}(x,t)dx \quad (2)$$

Where $I_{pixel}$ stands for the gray scale value of the pixel at location x and time t. A similar approach was applied in the present teachings to analyze the imaging data and compare with the sensor measurements. First, the color images were transformed into gray scale. A reference vertical line of pixels was set at 2 mm from the piton surface directly above the sensor. The reference boundary is shown as a red dashed line in FIG. 10. It is assumed that as the spray crosses the line, the luminosity at the boundary correlates with the flux of fuel that impinges on the area where the sensing element is located. The LIL was then temporally integrated to obtain the accumulated line integrated luminosity (ALIL) to assess the total amount of fuel that reached the sensor area as a function of time:

$$\text{ALIL} = \int_{t_0}^{t_i} \text{LIL}(t)dt \quad (3)$$

While this analysis can be used to understand and compare general trends, the results should be treated as semi-quantitative due to limitations of the imaging method (e.g., different extinction coefficients as a function of droplet size and fuel, variable optical thickness, etc.).

To understand and test the response of the capacitive sensor to different fuel blends, the electrodes were submerged in pools anhydrous ethanol (Decon Labs, Inc., 200 proof) and different concentrations of ethanol-gasoline blends (neat E0 gasoline from Gage Products, 40580-1BL). The liquid pool formed a layer on top of the sensor with a thickness of approximately 5 mm. As shown by the simulation results, this film thickness is beyond the saturation point of the capacitor, so the values from this test represent the maximum measurable response of the sensor.

Figure 11:
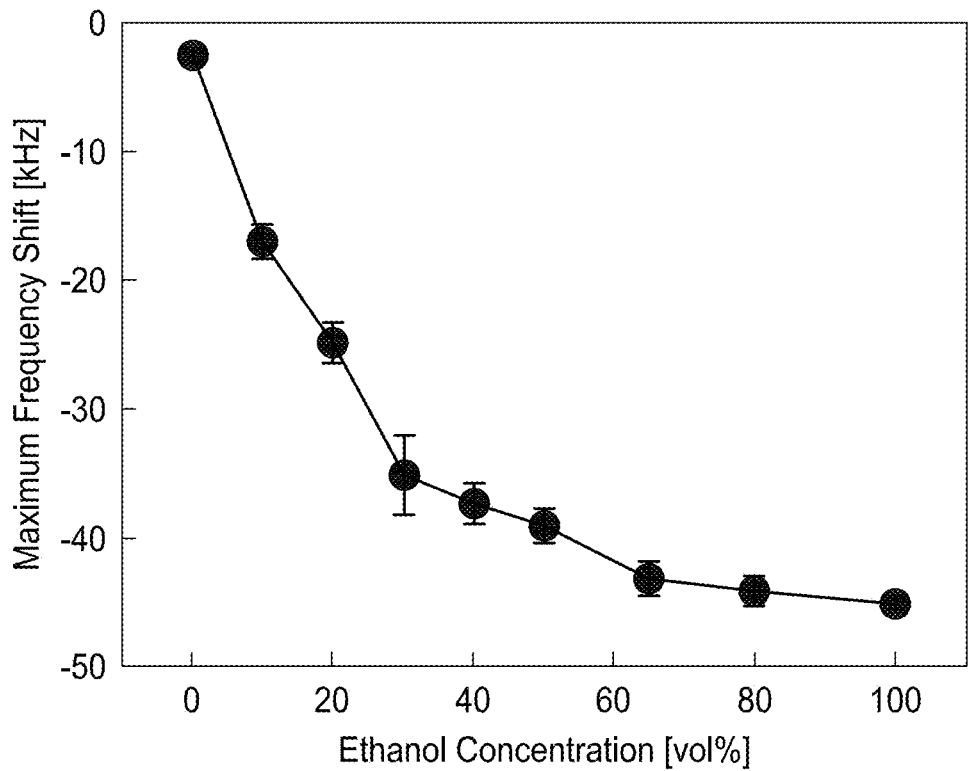
FIG. 11 is a measured maximum decrease in frequency for ethanol, gasoline, and ethanol-gasoline blends for the IDE with electrode widths of 150 µm and gaps of 80 µm.

The sensor had a resonant frequency of 65 kHz when exposed air. FIG. 11 shows the measured shift in frequency ($\Delta f_{fuel} - f_{air}$) experienced by the system when the sensor was exposed to each of the ethanol/gasoline fuel blends. The symbols represent the average of five measurements, and the error bars are the standard deviations. The sensor response increases with ethanol concentration approximately linearly for E0 to E30. At higher ethanol concentrations, the sensor response is less sensitive. Higher ethanol content increases the electric permittivity of the fuel, which causes the larger frequency shift as the ethanol concentration increases. The E100 (pure ethanol) generated the maximum frequency change of 46.2 kHz. Pure gasoline (E0) generated the lowest frequency shift of only 2.6 kHz.

The results have two important implications. Firstly, the data suggest that even blends with relatively low ethanol content (e.g., E20) generate a considerable change in frequency. This indicates the sensor is sensitive to the films generated by a broad range of ethanol-gasoline blends, demonstrating the wide potential scope for the use of the present impingement sensor.

The second significance of the results shown in FIG. 11 is that they indicate that the sensor is capable of measuring fuel composition; more specifically, it can detect levels of ethanol content in gasoline. As previously stated, E85 does not have a constant concentration of ethanol. Fuel composition variations introduce challenges to which the engine cannot easily react. Current flex-fuel vehicles (FFV) employ an ethanol 'virtual sensor' that retroactively calculates the alcohol content based on the exhaust gas oxygen (EGO) sensor reading and a closed feedback loop that control fueling parameters. Although this method is effective, its accuracy still generates concerns on component protection, fuel efficiency, and emissions for current and future engine technologies.

Capacitive sensing for fuel composition has been explored before with some success. Although capacitive sensing for determining alcohol concentration in fossil fuels has some remaining challenges to address, such a sensor could be placed in a vehicle fueling system and detect, in real-time, the ethanol percentage in the fuel tank. Having these real-time data would enable the engine operating parameters to be proactively adapted to optimize the vehicle performance for varying fuel composition "on the fly". For example, engines using E85 have problems starting, especially during cold conditions due to the higher enthalpy of vaporization of ethanol. Having a priori knowledge of the fuel composition would enable the use of proper fuel-composition specific ignition strategies during cold-cranking and engine start. An additional area of improvement is the fact that higher ethanol content enables a more aggressive ignition timing, which improves fuel efficiency; this strategy could be applied on-demand if the appropriate ethanol concentration is detected in the tank.

Figure 12:
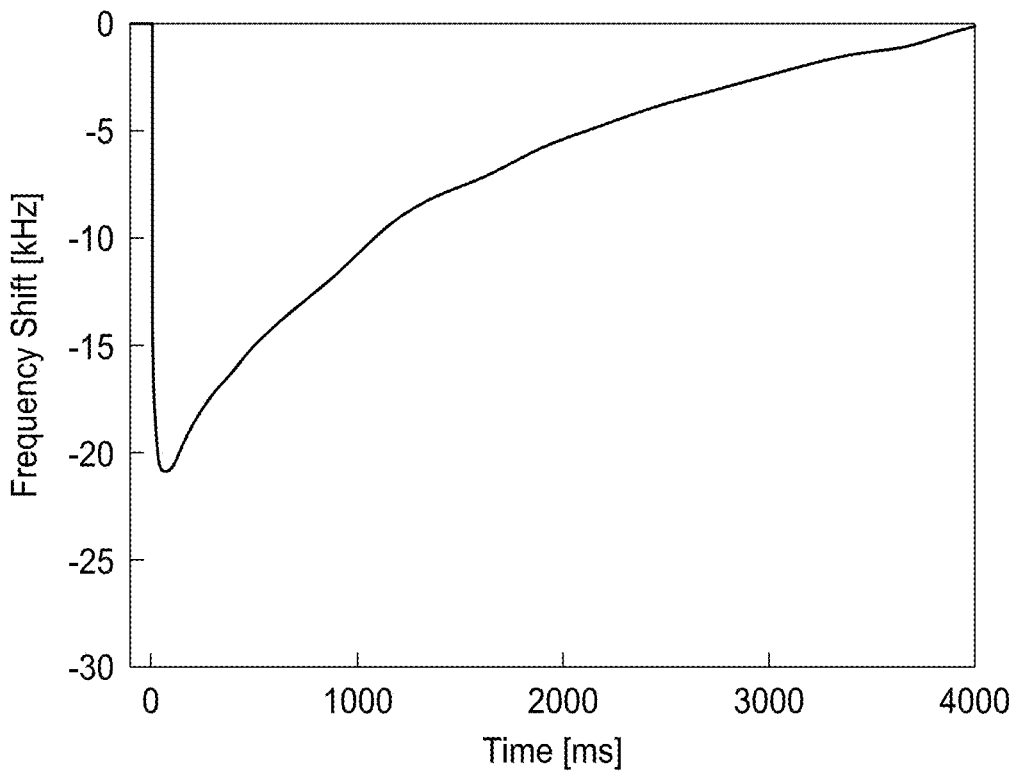
FIG. 12 is a typical result for the frequency shift of the impingement sensor.

After the initial results, the instrumented piston was placed inside the engine to test the fuel impingement from a realistic injection system. The resonant frequency was monitored using the telemetry system and the data were recorded for four seconds. FIG. 12 presents typical results for the frequency shift as a function of time obtained for an injection event of E50 at 100 bar and 0.5 ms. The results show the sensor response is fast enough to capture the spray impingement as indicated by the sudden decay in frequency. The sensor also captures how the film evaporates in about four seconds, as the frequency returns to the original value. In a warm engine, the evaporation rate will be significantly higher due to the hot surfaces and the in-cylinder charge motion. For reference, fuel films typically evaporate in a few dozen milliseconds.

The response of the sensor to fuel impingement from four ethanol-gasoline blends was tested by keeping the injection pressure and duration constant while varying the ethanol content. The fuel blends tested were E80, E50, E20, and E10, each at an injection pressure of 100 bar and injection duration of 2.0 ms. While it has been reported that the amount of fuel that impinges on a surface is dependent on the ethanol concentration of a blend, the objective of the present teachings was not to explore those effects, but rather to understand the sensitivity of the sensor to different fuel blends and determine the detectability limits of the sensor. The results have not been analyzed to determine intrinsic differences in the films formed. The goal of this part of the teachings was to demonstrate the sensor concept, and quantitative calibration remains future work.

Figure 13A:
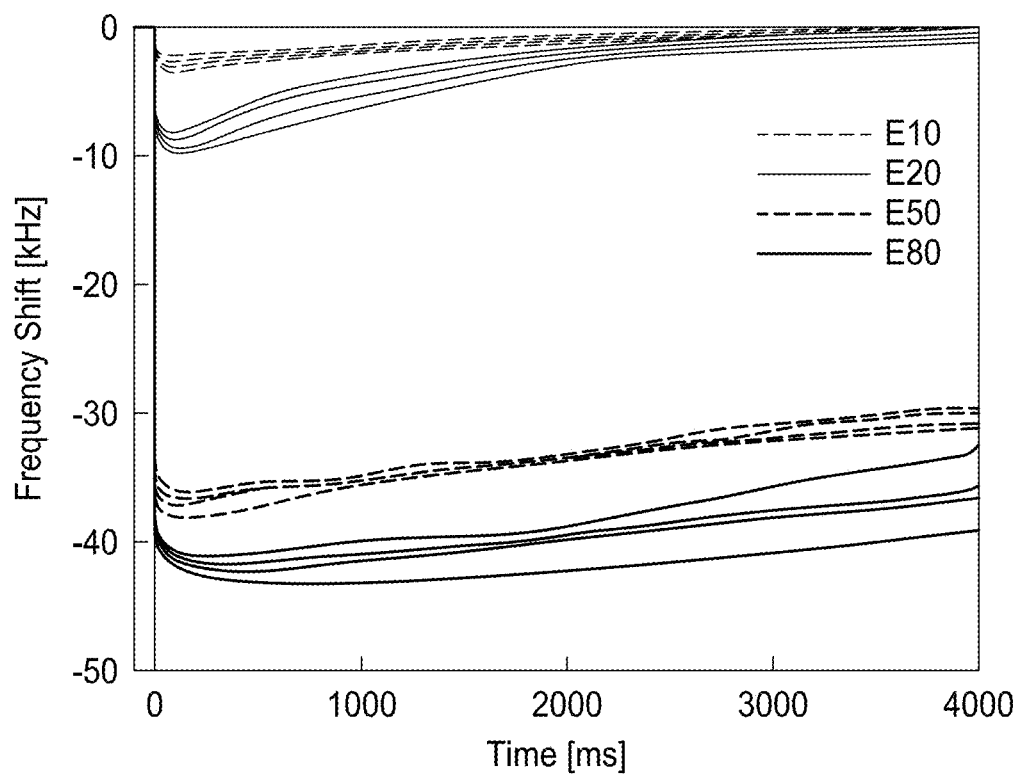
FIG. 13A is a sensor response to different ethanol-gasoline blends showing the 4 seconds of acquired data.
Figure 13B:
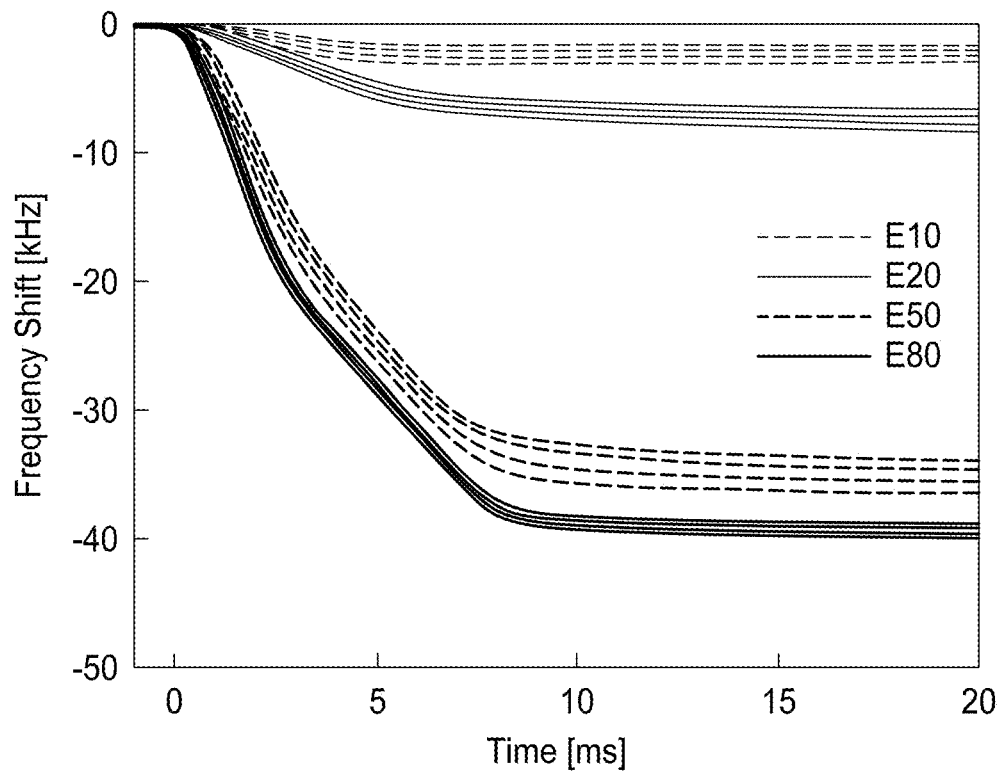
FIG. 13B is a sensor response to different ethanol-gasoline showing the first 20 ms of the test.

The results of the instrumented piston experiments are summarized in FIG. 13, which shows the sensor time histories of the five injection events for each fuel. FIG. 13A presents the frequency shift for the four seconds (4000 ms) during which the data was recorded, while FIG. 13B presents the first 20 ms after the spray impinges on the sensor. The thin yellow region in FIG. 13A corresponds to the 20 ms shown in FIG. 13B. As expected, the sensor exhibited higher sensitivity to increasing ethanol concentration, but overall the four fuels had similar behavior, with large frequency change within the first 10 ms, followed by a slower decay due to evaporation that lasted a few seconds. E50 and E80 experienced longer evaporation times than the four seconds shown in the figure. Additional testing indicated the evaporation times for E50 and E80 were on the order of 10 s.

Figure 10:
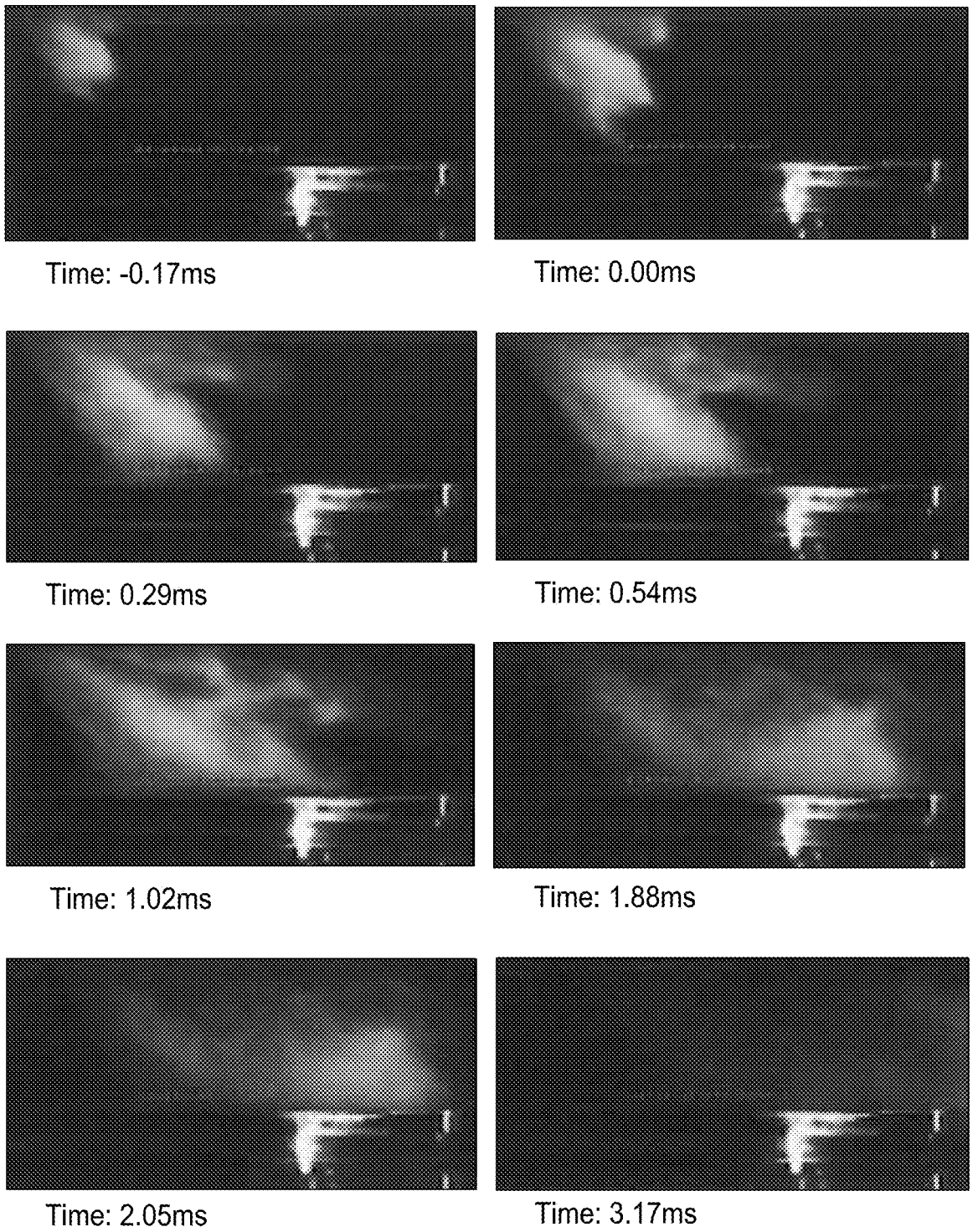
FIG. 10 shows imaging data for E50 fuel spray at an injection pressure of 100 bar and an injection duration of 2.0 ms at various time steps. The red line shows the location used for comparison of the spray images with the sensor results.

In FIG. 13B, the E50 and E80 tests displayed three regions with distinct characteristic slopes; the first one from t=0s 2 ms, the second from 2 ms to about 8 ms, and the last from 8 ms to the end of the test. The behavior indicates the film formed during impingement experiences three distinct phases during each fuel injection event. The first phase, which coincides well with the 2 ms injection duration, is characterized by a rapid frequency shift, indicating the rate of fuel deposition is the highest during this phase. After the end of injection, the frequency shift continues to decrease, but at a lower rate, indicating the film continued to grow even after the end of injection. Two explanations are possible for film growth. First, FIG. 10 shows that even after the injector closes, a fuel cloud lingers after the 2 ms injection duration and the images indicate the cloud deposits on top of the piston and sensor. The deposition rate of the fuel droplets is lower than the fuel deposited by the momentum of the injection event, which would explain the decrease in slope at 2 ms in FIG. 13B. A second explanation could be that the film reconfigures due to surface tension after the momentum of the spray is no longer present. It is possible that the effects of surface tension may increase the thickness of the film while potentially decreasing the area. After some period of time, the film behavior is dominated by evaporation, as shown in FIG. 13A. More in-depth analysis of the liquid film physics and experimentation are needed to more precisely understand the physics leading to the observed behaviors. Importantly, the results demonstrate the sensor capability to detect fuel impingement and capture the dynamics of the films formed.

Figure 14A:
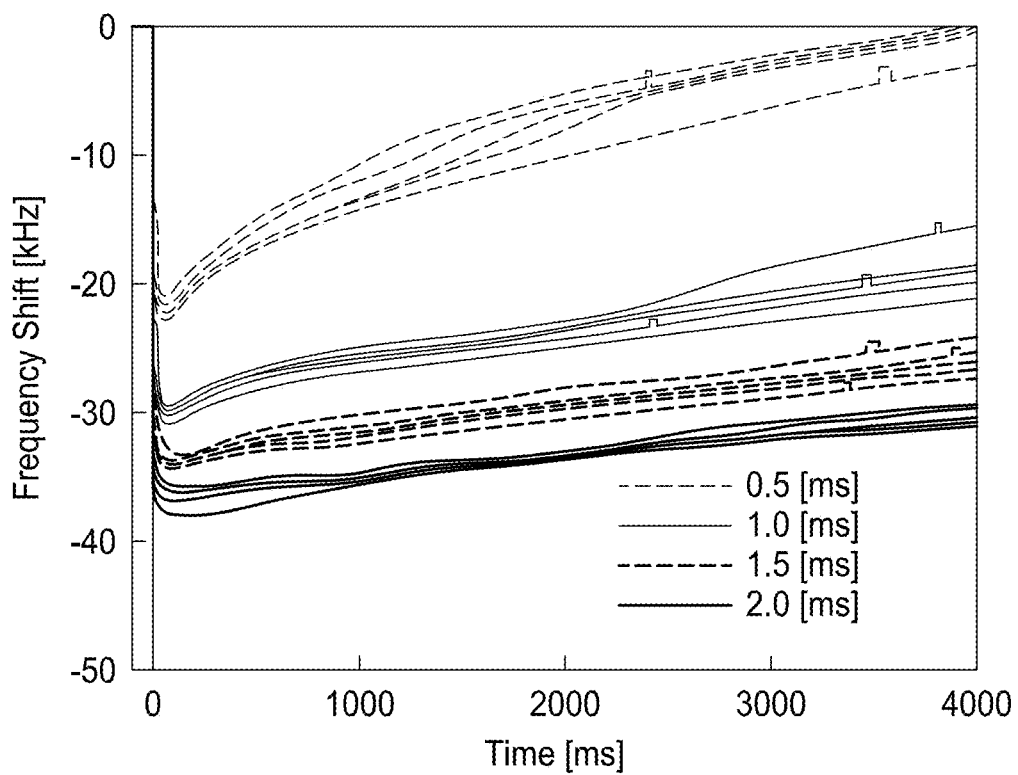
FIG. 14A is a sensor response for E50 with 100 bar injection pressure and multiple injection durations showing the 4000 seconds of acquired data.

The effect of injection duration was also explored. The injection pressure was maintained at 100 bar while the injection pulse width was varied from 2.0 to 0.5 ms, effectively changing the injected fuel mass. FIG. 14 shows the frequency shift as a function of time for the tests with E50; similar behaviors were obtained for the other fuel blends. The long-time and early-time behaviors are shown in the figure. The results show the frequency change is larger for longer injection durations. Because the injection pressure was constant for the experiments, the injected fuel mass scales with injection duration. It is expected that, to a certain degree, the film characteristics—e.g., film thickness and area—would in turn scale with injected fuel mass. Evaporation time also increased with injection duration (and injected mass). The results show the trends expected for changes in fuel mass are well-captured by the sensor.

Figure 14B:
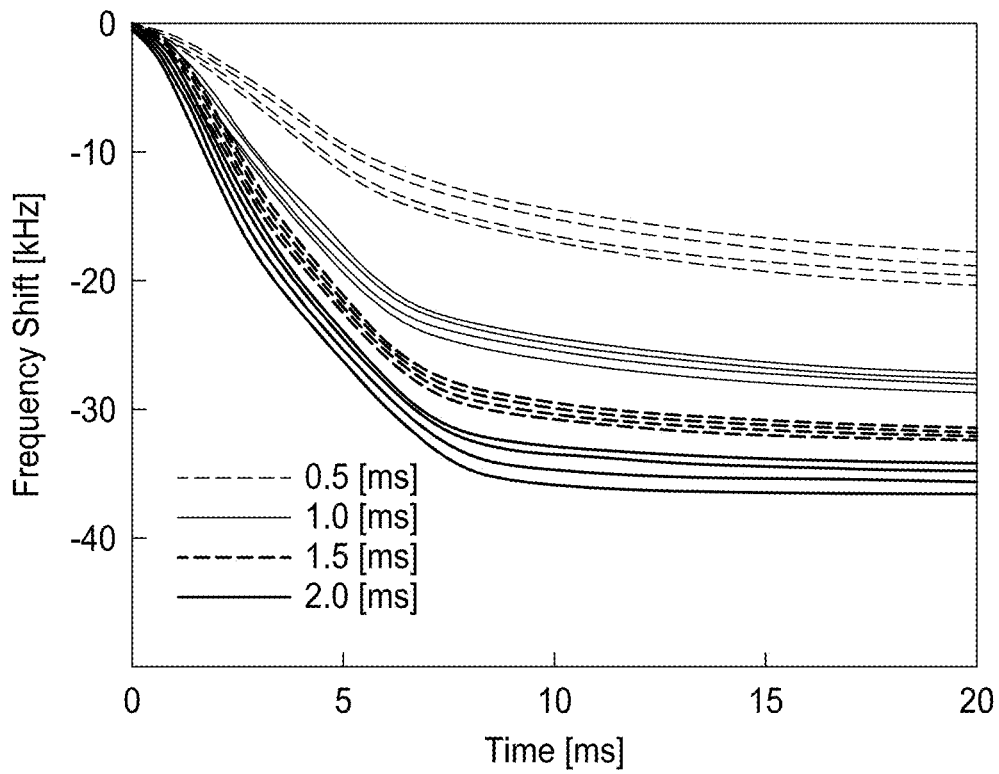
FIG. 14B is a sensor response for E50 with 100 bar injection pressure and multiple injection durations that zooms in to the first 20 ms of the test.

The results in FIG. 14B show the same three-region behavior observed in FIG. 13B. However, the slope of the frequency change after 5 ms appears to be influenced by the injection duration. Specifically, the slope for the shortest injection (0.5 ms) has a steeper slope after 5 ms, which implies the rate of fuel deposition was larger for the shortest injection duration after injection had ended.

Figure 15:
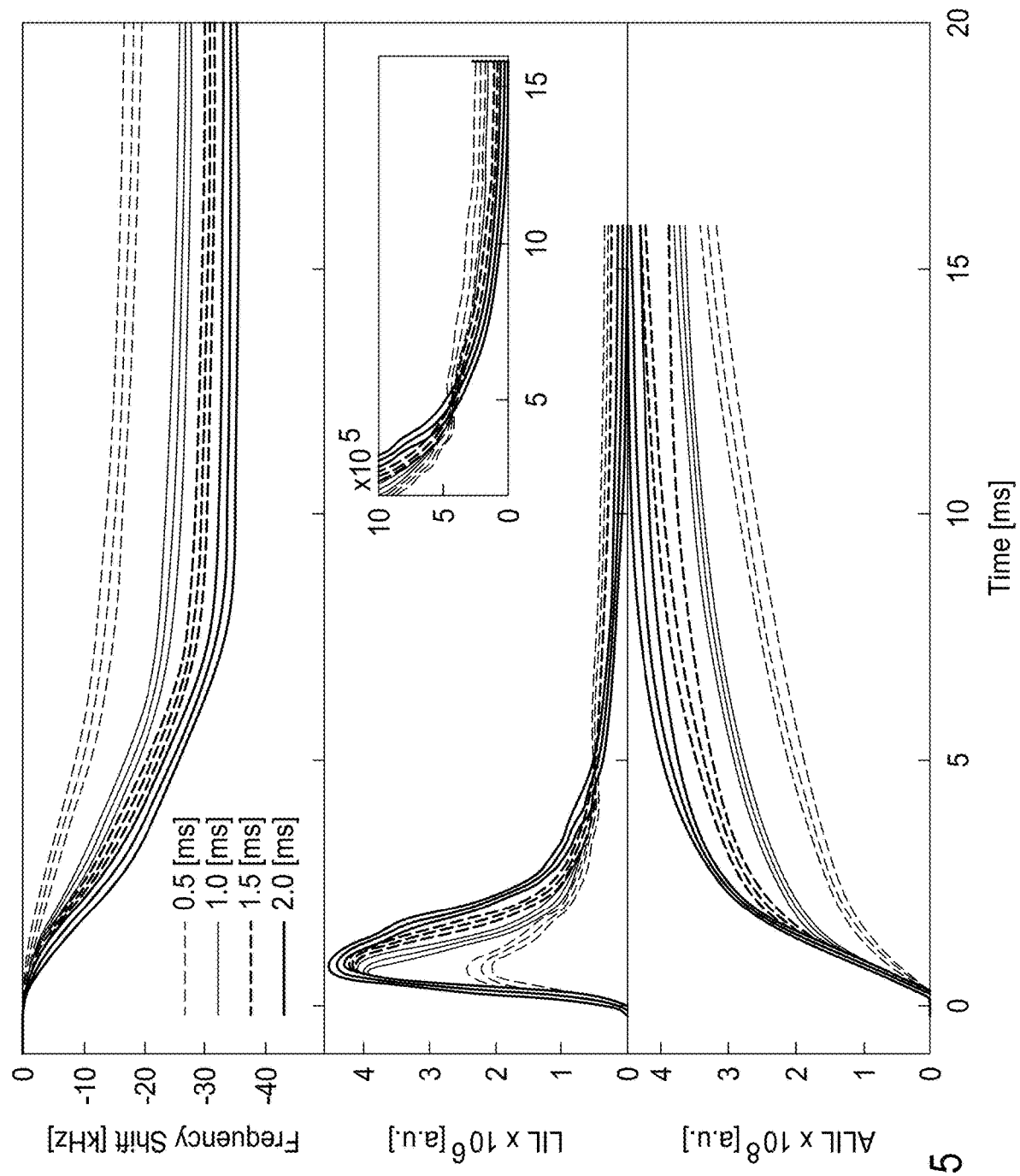
FIG. 15 shows results for frequency shift, line-integrated luminescence (LIL), and accumulated LIL (ALIL) for E50 during different injection durations at 100 bar.
Figure 16A:
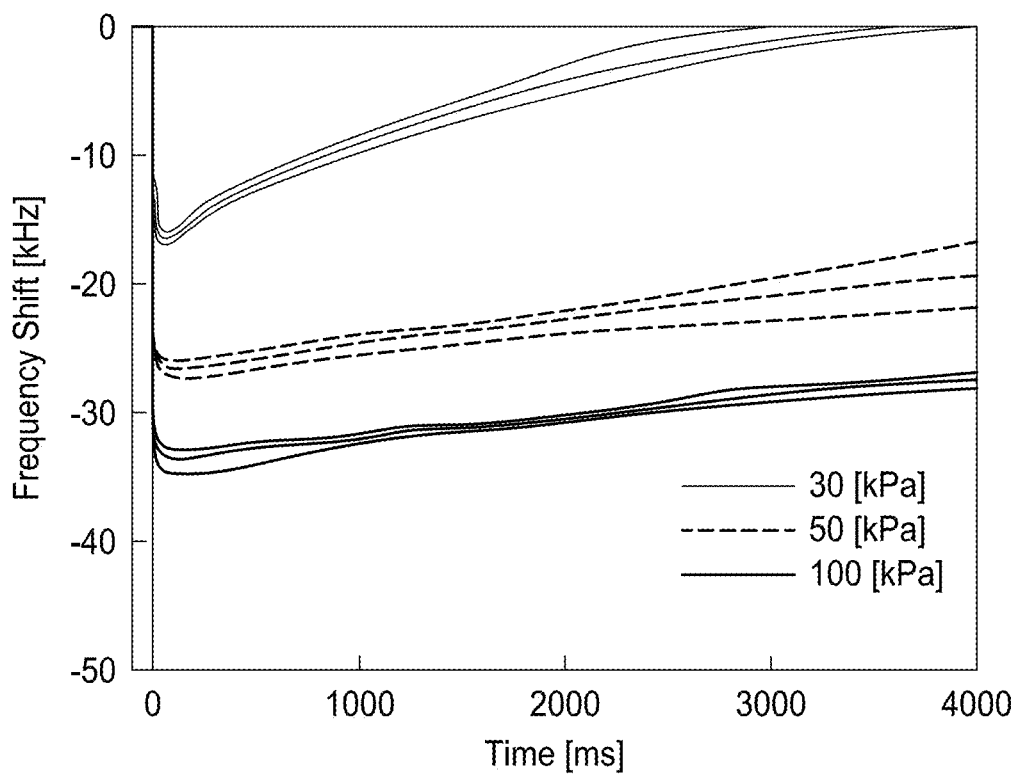
FIG. 16A is a sensor response, LIL, and ALIL results for E50 with injection duration of 2.0 ms and injection pressures showing the 4000 seconds of acquired data.
Figure 16B:
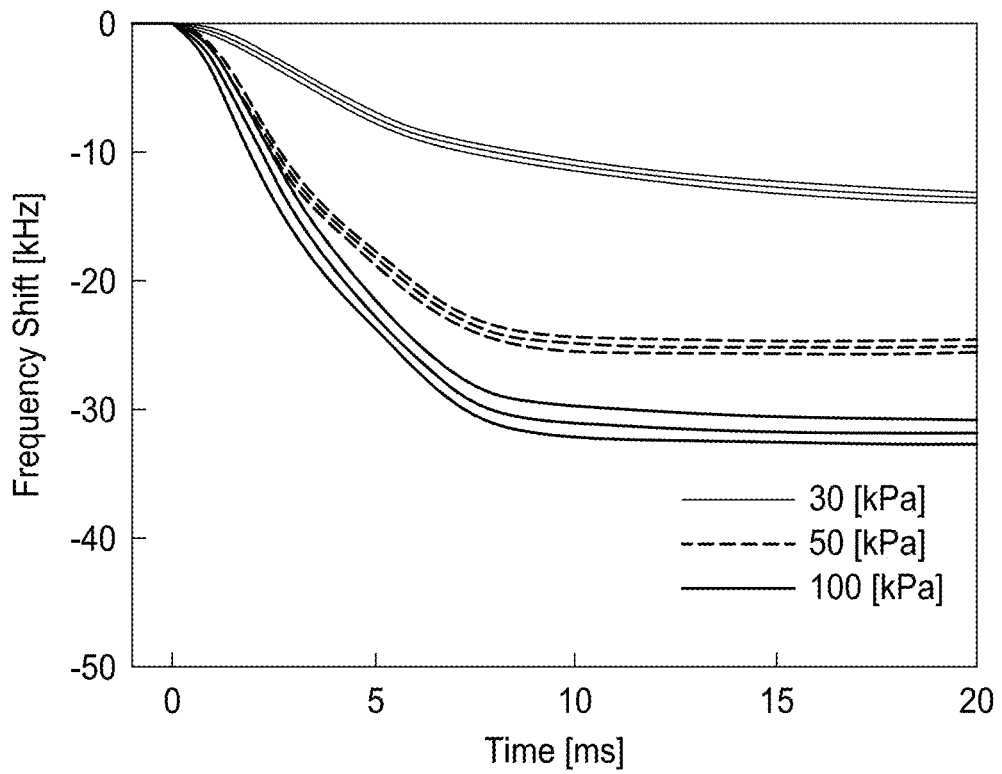
FIG. 16B is a sensor response, LIL, and ALIL results for E50 with injection duration of 2.0 ms and injection pressures that zooms in to the first 20 ms of the test.
Figure 16C:
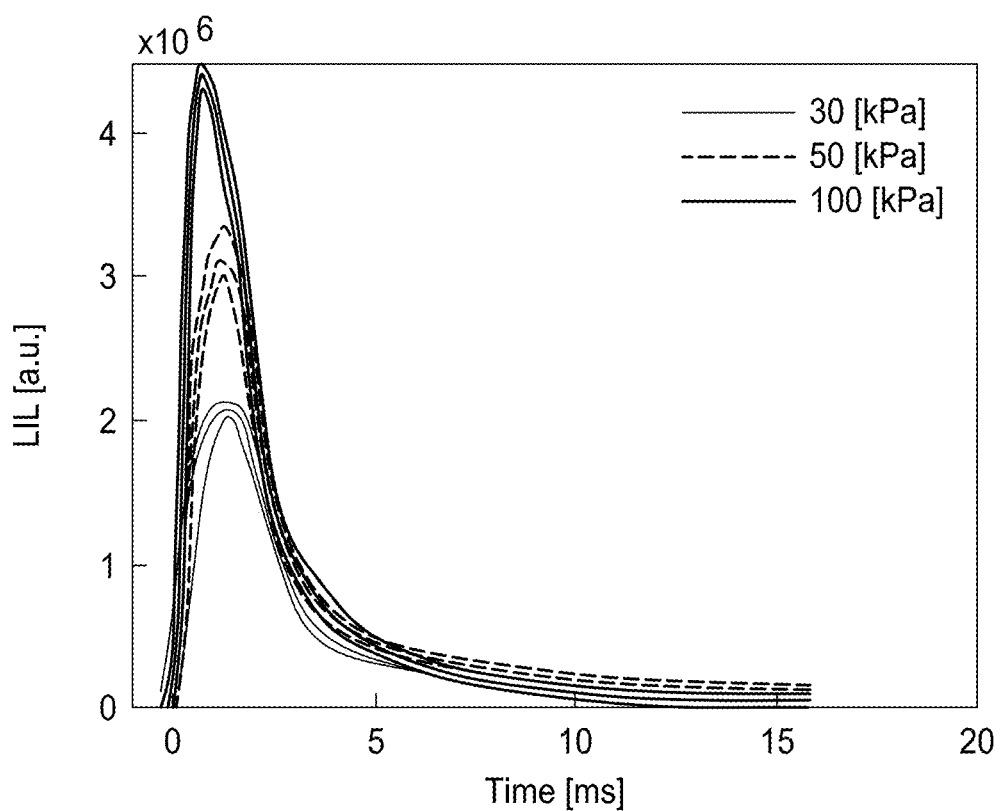
FIG. 16C is a sensor response, LIL, and ALIL results for E50 with injection duration of 2.0 ms and injection pressures showing the LIL.
Figure 16D:
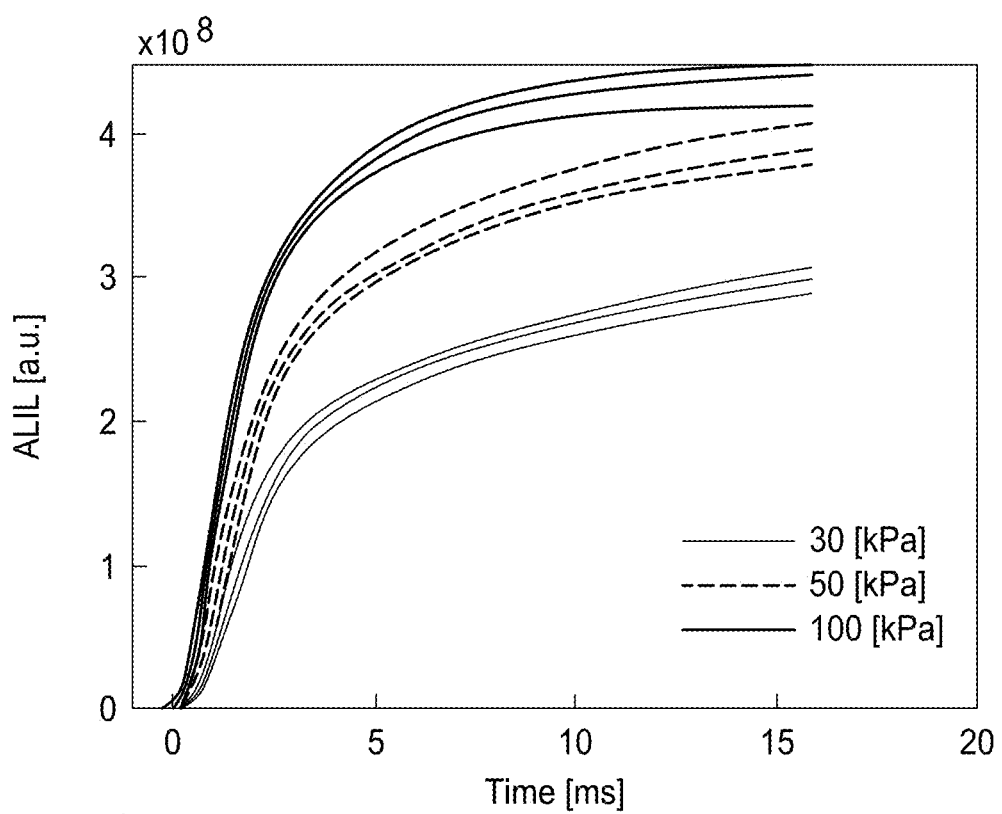
FIG. 16D is a sensor response, LIL, and ALIL results for E50 with injection duration of 2.0 ms and injection pressures presenting the ALIL as a function of time derived from the imaging data.

To better understand the observations, the LIL and ALIL of the imaging data for the tests were computed. FIG. 15 shows the response of the sensor (top) with the LIL (middle) and ALIL (bottom) time-histories of the tests. The results show both the LIL and ALIL scaled with injection duration in the same manner as the sensor response. Secondly, the ALIL results displayed a similar change in slope as observed in the frequency shift at the end of injection for each of the injection durations. Finally, focusing on the results after the 5 ms, the LIL was higher for the shortest injection timing and the ALIL had a higher slope. The results from the imaging data indicate that fuel deposits at a higher rate for the shorter injection duration after the end of injection, confirming the trends observed in the sensor data. Visual inspection of the imaging data confirmed that fuel lingers for a longer time when the injection duration is short, which is likely caused by the lower momentum transfer when shortening the injection.

FIG. 16 presents the effects of injection pressure on the response of the sensor, the LIL and the ALIL for the E50 experiments. Similar trends were observed for the other fuel blends. The three metrics show similar behaviors, indicating higher impingement with increasing pressure. Since the injection duration was constant for these experiments (2.0 ms), varying the injection pressure also changed the injected mass, which explains the observed trends. Lower pressure (and therefore lower injected mass) correlates with less impingement as indicated by the three metrics. The behavior differs from the trends observed by Schulz et al. and Fatouraie et al., where less impingement was associated with increasing injection pressures, due to better atomization and momentum transfer. However, unlike in the present teachings, Schulz et al. and Fatouraie et al. kept the injected mass constant, which would account for the difference in trends. Overall, the agreement between the three metrics used in the present work demonstrates the effectiveness of the sensor to detect and characterize impingement at different spray conditions.

Fuel impingement in direct injection engines is one of the main sources of soot emissions and unburned hydrocarbons. Although much has been learned about spray-wall interaction through single droplet experiments and other experimental and computational methods, diagnostic tools to characterize spray impingement in-situ are still lacking. These teachings presented the design, fabrication, and demonstration of a novel sensor based on an interdigitated electrode (IDE) capacitor for detecting and characterizing thin films generated by spray impingement from ethanol-gasoline blends. The sensor was instrumented in a piston and tests were performed using a realistic injection system in a static engine at ambient conditions, while the impingement was imaged using high-speed imaging. A few outcomes and conclusions from these teachings include:

A new method for non-contact data transmission based on IR light pulses is developed and implemented which avoids physical connections to the moving parts of the engine. The telemetry circuit was effective at transmitting the measurements from the instrumented piston. The transmission approach has the potential to be used in other engine research applications where non-contact data transmission is needed.

The sensor sensitivity to fuel films increased as the concentration of ethanol increased, and blends with all ranges of ethanol concentration, including relatively low ethanol content (e.g. E20) generated excellent sensor response (e.g., time response less than 0.5 ms).

The behavior of the films detected by sensor scaled with injection duration and injection pressure as expected based on the effects on injected fuel mass. The trends measured by the sensor agreed with optical metrics derived from fuel spray imaging data.

The sensor showed the film growth and decay follows a three-regime evolution with different deposition rates observed during and after the injection event. The first regime is characterized by fast growth rate and coincides with the injection duration. The second regime has a slower deposition rate and is driven by fuel that lingers after the end of injection and slowly deposits on the surface of the piston and sensor. During the last phase, the sensor response is dominated by slower film evaporation. The first two regimes were corroborated by the imaging data.

Overall, the present sensor achieved the original design objectives: to enable in-situ measurements, to use non-contact data transmission, to have high-spatial sensitivity to thin films, to display fast temporal response capable of capturing the dynamics of the film formation, and to use an inexpensive fabrication.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A sensor device system for detection of an adjacent liquid, the sensor device and data transmission system comprising:
   a glass fiber laminate substrate;
   at least one pair of comb electrodes formed on the glass fiber laminate substrate, a first of the pair of comb electrodes being interdigitated with a second of the pair of comb electrodes, the pair of comb electrodes defining geometric parameters; and
   a passivation coating covering the pair of comb electrodes.

2. The sensor device system according to claim 1 further comprising:
an insert member having an upper portion and a lower portion, the upper portion being configured to retain at least the pair of comb electrodes;
a chamber formed in the lower portion;
a metering circuit operably coupled to the pair of comb electrodes, the metering circuit being disposed at least partially in the chamber; and
an output device operably coupled to the metering circuit and outputting a signal from the metering circuit.

3. The sensor device system according to claim 2 further comprising:
a receiving circuit configured to monitor and detect the signal from the metering circuit.

4. The sensor device system according to claim 1 wherein the geometric parameters of the pair of comb electrodes comprise an electrode thickness.

5. The sensor device system according to claim 4 wherein the electrode thickness is about 35 μm.

6. The sensor device system according to claim 1 wherein the geometric parameters of the pair of comb electrodes comprise an electrode width.

7. The sensor device system according to claim 6 wherein the electrode width ranges from 25 to 200 μm.

8. The sensor device system according to claim 1 wherein the geometric parameters of the pair of comb electrodes comprise an electrode spacing gap.

9. The sensor device system according to claim 8 wherein the electrode spacing gap ranges from 25 to 150 μm.

10. The sensor device system according to claim 1 wherein the passivation coating comprises a conformal layer of alumina.

11. The sensor device system according to claim 1 wherein the pair of comb electrodes are copper.

* * * * *